US006618942B2

(12) United States Patent
Beaman et al.

(10) Patent No.: US 6,618,942 B2
(45) Date of Patent: Sep. 16, 2003

(54) METHOD FOR INSERTION OF INSERTING PRINTED CIRCUIT CARD INTO SOCKET CONNECTORS

(75) Inventors: Brian S. Beaman, Apex, NC (US); Scott J. Hadderman, Pleasant Valley, NY (US); Richard D. Wheeler, Millerton, NY (US)

(73) Assignee: International Business Machines Corporation, Armonk, NY (US)

( * ) Notice: Subject to any disclaimer, the term of this patent is extended or adjusted under 35 U.S.C. 154(b) by 138 days.

(21) Appl. No.: 09/970,618

(22) Filed: Oct. 4, 2001

(65) Prior Publication Data

US 2003/0066189 A1 Apr. 10, 2003

(51) Int. Cl.7 ................................................ H05K 13/00

(52) U.S. Cl. ............................. 29/854; 439/59; 439/62; 439/67; 439/260; 439/267; 439/329

(58) Field of Search ............................ 439/62, 67, 329, 439/59, 260, 267; 29/854

(56) References Cited

U.S. PATENT DOCUMENTS 2,811,700 A * 10/1957 Kuch
3,731,252 A * 5/1973 McKeown et al.
3,858,957 A * 1/1975 Harwood et al.
4,373,764 A * 2/1983 Ulrich
5,049,087 A * 9/1991 Chung et al.

* cited by examiner

*Primary Examiner*—Carl J. Arbes
(74) *Attorney, Agent, or Firm*—Lynn L. Augspurger

(57) ABSTRACT

A method for insertion of inserting printed circuit card into socket connectors which prevents sockets from getting contaminated or damaged during the insertion of a printed circuit card comprises the steps of: inserting a cam for moving a socket connector's contacts outwardly so that they will not make contact with a card's edge when it is inserted between the contacts of the sockets connector as it is inserted, and after the printed circuit card is inserted the printed circuit card moving the printed circuit card until it makes contact with a stop in the socket connector, and after the printed circuit card has contacted the stop in the socket connector, moving the cam to a closed position allowing the printed circuit card to be seated, and seating the printed circuit card by moving it to cause and allow for an amount of wipe to clean the connector's contacts without contaminating or damaging the socket connector's contacts during the insertion of said printed circuit card.

1 Claim, 1 Drawing Sheet

METHOD FOR INSERTION OF INSERTING PRINTED CIRCUIT CARD INTO SOCKET CONNECTORS

FIELD OF THE INVENTION

This invention relates to printed circuit card edge card socket connectors, and particularly to a method for preventing the sockets from getting contaminated or damaged during the insertion of a printed circuit card.

BACKGROUND

The problem with current edge card connectors is that the connector's contacts are damaged and/or contaminated by contact with a card's edge during insertion. This damage can lead to corrosion and reduces the connection system's reliability. Sockets have consistently presented a reliability problem. Alternate approaches have relied on different anti-corrosion greases and have provided limited success. Grease schemes, however, do not provide for the reliability needed for today's mid to high end computer system reliability requirements. What is needed is a solution which prevents the sockets from getting contaminated or damaged during the insertion of a printed circuit card and improves reliability.

SUMMARY OF THE INVENTION

In accordance with the invention illustrated, we have provided a method for insertion of inserting printed circuit card into socket connectors which prevents sockets from getting contaminated or damaged during the insertion of a printed circuit card. The method comprises the steps of providing a cam for moving a socket connector's contacts outwardly so that they will not make contact with a card's edge when it is inserted between the contacts of the sockets connector as it is inserted, and after the printed circuit card is inserted the printed circuit card moving the printed circuit card until it makes contact with a stop in the socket connector, and after the printed circuit card has contacted the stop in the socket connector, moving the cam to a closed position allowing the printed circuit card to be seated, and seating the printed circuit card by moving it to cause and allow for an amount of wipe to clean the connector's contacts. The advantage of this method is that the connector's sockets remain damage and contamination free, therefore dramatically improving reliability.

These and other improvements are set forth in the following detailed description. For a better understanding of the invention with advantages and features, refer to the description and to the drawings.

DETAILED DESCRIPTION OF THE INVENTION

Figure 1:
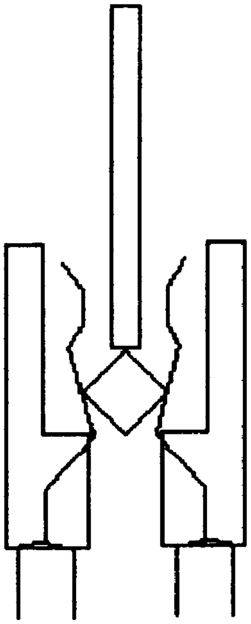
FIG. 1 illustrates the preferred embodiment of the invention with a cam provided for moving a connector's contacts.
Figure 2:
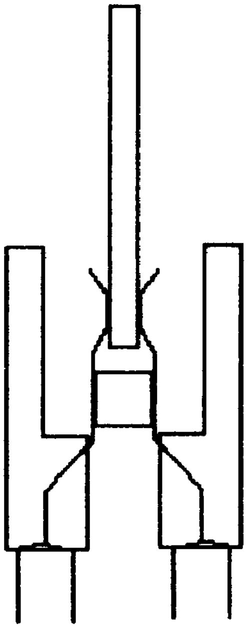
FIG. 2 illustrates illustrates the preferred embodiment of the invention after the printed circuit card contacts a stop in the connector allowing the cam to be moved to the illustrated closed position.
Figure 3:
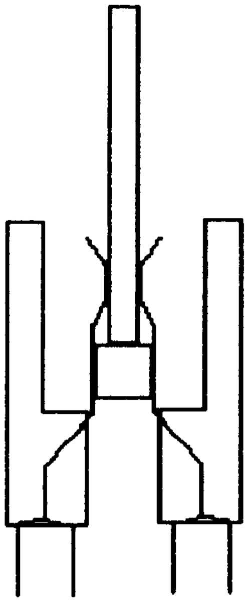
FIG. 3 illustrates illustrates the preferred embodiment of the invention after the cam is moved to a closed position and the printed circuit card is seated. Our detailed description explains the preferred embodiments of our invention, together with advantages and features, by way of example with reference to the drawings.

As illustrated in the drawings the preferred embodiment of the invention includes a cam 10 for moving the connector's 11 contacts 12 so that they do not make contact with a printed circuit card's edge 13 as it is inserted between the connector's 11 contacts as shown in FIG. 1. During the insertion the printed circuit card 13 contacts a stop 14 provided by the edge of the cam 10 in the socket connector 11, and then the the cam can be and is moved to a closed position illustrated in FIG. 2 by rotation of the cam element 10 axially and then the printed circuit card is inserted fully to the point where the printed circuit card can be and is seated as illustrated by FIG. 3 whereupon a proper amount of wipe is caused by the insertion and seating action to clean the connector's contacts. The advantage of this design is that the connector's sockets remain damage and contamination free, therefore dramatically improving reliability.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for insertion of inserting printed circuit card into socket connectors which prevents sockets from getting contaminated or damaged during the insertion of a printed circuit card comprising the steps of:

Providing a cam for moving a socket connector's contacts outwardly so that they will not make contact with a card's edge when it is inserted between the contacts of the sockets connector as it is inserted, and after the printed circuit card is inserted the printed circuit card moving the printed circuit card until it makes contact with a stop in the socket connector, and after the printed circuit card has contacted the stop in the socket connector, moving the cam to a closed position allowing the printed circuit card to be seated, and seating the printed circuit card by moving it to cause and allow for an amount of wipe to clean the connector's contacts without contaminating or damaging the socket connector's contacts during the insertion of said printed circuit card.

* * * * *